(12) United States Patent
Kihara et al.

(10) Patent No.: US 7,931,819 B2
(45) Date of Patent: Apr. 26, 2011

(54) METHOD FOR PATTERN FORMATION

(75) Inventors: Naoko Kihara, Matsudo (JP); Hiroyuki Hieda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1028 days.

(21) Appl. No.: 11/727,158

(22) Filed: Mar. 23, 2007

(65) Prior Publication Data

US 2008/0041818 A1    Feb. 21, 2008

(30) Foreign Application Priority Data

Aug. 15, 2006  (JP) ................. 2006-221555

(51) Int. Cl.
*H01L 21/302* (2006.01)

(52) U.S. Cl. ............... 216/41; 216/22; 216/51; 216/58; 216/67; 216/79; 438/735; 438/942

(58) Field of Classification Search .................. None
See application file for complete search history.

(56) References Cited

U.S. PATENT DOCUMENTS

| | | | |
|---|---|---|---|
| 4,944,961 A | 7/1990 | Lu et al. | |
| 6,565,763 B1 * | 5/2003 | Asakawa et al. | 216/56 |
| 6,748,865 B2 | 6/2004 | Sakurai et al. | |
| 7,105,280 B1 | 9/2006 | Deeman et al. | |
| 7,347,953 B2 * | 3/2008 | Black et al. | 216/83 |
| 7,605,081 B2 * | 10/2009 | Yang et al. | 438/672 |
| 7,686,972 B2 * | 3/2010 | Hieda et al. | 216/67 |
| 2003/0222048 A1 | 12/2003 | Asakawa et al. | |
| 2004/0191577 A1 | 9/2004 | Suwa et al. | |
| 2004/0209123 A1 | 10/2004 | Bajorek et al. | |
| 2005/0161427 A1 | 7/2005 | Okawa et al. | |
| 2005/0282038 A1 | 12/2005 | Yamamoto et al. | |
| 2005/0284320 A1 | 12/2005 | Sakuarai et al. | |
| 2006/0012904 A1 | 1/2006 | Naruse et al. | |
| 2006/0176606 A1 | 8/2006 | Soeno et al. | |
| 2007/0065588 A1 | 3/2007 | Kihara et al. | |
| 2007/0070548 A1 | 3/2007 | Shirotori et al. | |
| 2007/0090087 A1 | 4/2007 | Shirotori et al. | |
| 2007/0207263 A1 | 9/2007 | Hieda et al. | |
| 2007/0281220 A1 * | 12/2007 | Sandhu et al. | 430/5 |

(Continued)

FOREIGN PATENT DOCUMENTS

CN    1815569    8/2006

(Continued)

OTHER PUBLICATIONS

Office Action in Korean Application No. 10-2007-60919 dated Sep. 25, 2008 and English-language translation thereof.

(Continued)

*Primary Examiner* — Anita K Alanko
(74) *Attorney, Agent, or Firm* — Nixon & Vanderhye, PC

(57) ABSTRACT

There is provided a method for pattern formation, including a step of coating a composition comprising a block copolymer, a silicon compound, and a solvent for dissolving these components onto an object to form a layer of the composition on the object, a step of subjecting the layer of the composition to self-organization of the block copolymer to cause phase separation into a first phase, in which the silicon compound is localized, having higher etching resistance by heat treatment or/and oxygen plasma treatment, and a second phase comprising a polymer phase and having lower etching resistance by heat treatment or/and oxygen plasma treatment, and thereby forming a pattern layer with a fine pattern, and a step of etching the object using as a mask the thus formed pattern layer.

10 Claims, 2 Drawing Sheets

U.S. PATENT DOCUMENTS

| | | | |
|---|---|---|---|
| 2007/0289943 A1* | 12/2007 | Lu et al. | 216/41 |
| 2008/0038467 A1* | 2/2008 | Jagannathan et al. | 427/256 |
| 2008/0041818 A1 | 2/2008 | Kihara | |
| 2008/0193658 A1* | 8/2008 | Millward | 427/401 |
| 2009/0034115 A1 | 2/2009 | Soeno et al. | |
| 2009/0078673 A1* | 3/2009 | Kihara et al. | 216/11 |
| 2009/0130380 A1 | 5/2009 | Asakawa et al. | |

FOREIGN PATENT DOCUMENTS

| | | |
|---|---|---|
| JP | 60-211939 | 10/1985 |
| JP | 62-161148 | 7/1987 |
| JP | 2-90172 | 3/1990 |
| JP | 2001-044794 | 2/2001 |
| JP | 2001-151834 | 6/2001 |
| JP | 2003-155365 | 5/2003 |
| JP | 2003-332313 | 11/2003 |
| JP | 2004-265474 | 9/2004 |
| JP | 2004-295989 | 10/2004 |
| JP | 2004-342226 | 12/2004 |
| JP | 2005-023358 | 1/2005 |
| JP | 2005-041931 | 2/2005 |
| JP | 2005-056547 | 3/2005 |
| JP | 2006-012216 | 1/2006 |
| JP | 2006-031848 | 2/2006 |
| JP | 2006-048751 | 2/2006 |
| JP | 2006-216171 | 8/2006 |
| JP | 2006-334693 | 12/2006 |
| JP | 2007125699 | 5/2007 |

OTHER PUBLICATIONS

Chinese Office Action dated Oct. 23, 2009 in Chinese Application No. 2007101280508.

Japanese Office Action of Japanese Application No. 2006-221555 dated Aug. 21, 2009 (with English Translation), 5 pages.

Freer et al., *Oriented Mesoporous Organosilicate Thin Films*, Nano Letters, 2005, vol. 5, No. 10, pp. 2014-2018, publ on web Sep. 17, 2005.

Sundström et al., *Patterning ~20 nm half-pitch lines on silicon using a self-assembled organosilicate etch mask*, Applied Physics Letters, 88, 243107 (2006), 3 pages, publ online Jun. 13, 2006.

Mansky et al., *Nanolithographic templates from diblock copolymer thin films*, Appl. Phys. Lett. 68 (18), Apr. 29, 1996, pp. 2586-2588.

Park et al., *Block Copolymer Lithography: Periodic Arrays of ~$10^{11}$ Holes in 1 Square Centimeter*, Science, vol. 276, May 30, 1997, pp. 1401-1404.

Segalman et al., *Controlling the Long Range Ordering of Block Copolymer Micelle Films*, Bulletin of the American Physical Society, 45, 559, 1 page.

Trawick et al., *Alignment of Block Copolymer Spherical Microdomains Using Substrate Features*, Bulletin of the American Physical Society, 46, 1000, 1 page, Mar. 2001 meeting.

Park et al., *Large area dense nanoscale patterning of arbitrary surfaces*, Applied Physics Letters, vol. 79, No. 2, Jul. 9, 2001, pp. 257-259.

Katsuyuki Naito; "Ultrahigh density storage media prepared by artificially assisted self-assembling methods", Chaos 15 (4), Dec. 2005, pp. 047507-1 to 047507-7.

Naito et al., "2.5-Inch Disk Patterned Media Prepared by an Artificially Assisted Self-Assmbling Method" IEEE Transactions on Magnetics, vol. 38 No. 5, Sep. 2002, pp. 1949-1951.

Jian Wang et al.; "Direct nanoimprint of submicron organic light-emitting structures"; Applied Physics Letters; vol. 75, No. 18; Nov. 1, 1999; pp. 2767-2769.

Freer et al., *Oriented Meso porous Organosilicate Thin Films*, Nano Letters, 2005, vol. 5, No. 10, pp. 2014-2018, Sep. 17, 2005.

Sundström et al., *Patterning ~20 nm half-pitch lines on silicon using a self-assembled organosilicate etch mask*, Applied Physics Letters, 88, 243107 (2006), 3 pages, Jun. 13, 2006.

Mansky et al., *Nanolithographic templates from diblock copolymer thin films*, Appl. Phys. Lett. 68 (18), Apr. 29, 1996, pp. 2586-2588.

Park et al., *Block Copolymer Lithography: Periodic Arrays of ~$10^{11}$ Holes in 1 Square Centimeter*, Science, vol. 276, May 30, 1997, pp. 1401-1404.

Segalman et al., *Controlling the Long Range Ordering of Block Copolymer Micelle Films*, Bulletin of the American Physical Society, 45, 559, 1 page (Abstract).

Trawick et al., *Alignment of Block Copolymer Spherical Microdomains Using Substrate Features*, Bulletin of the American Physical Society, 46, 1000, 1 page (Abstract).

Park et al., *Large area dense nanoscale patterning of arbitrary surfaces*, Applied Physics Letters, vol. 79, No. 2, Jul. 9, 2001, pp. 257-259.

Dario Pisignano et al.; "Room-Temperature Nanoimprint Lithography of Non-thermoplastic Organic Films"; Advanced Materials; No. 6; Mar. 18, 2004; pp. 525-529.

Atsushi Yokoo et al.; "Organic Photonic Crystal Band Edge Laser Fabricated by Direct Nanoprinting"; Japanese Journal of Applied Physics, vol. 43, No. 6B; 2004; pp. 4009-4011, Jun. 29, 2004.

Hattori et al.; "Fabrication of Discrete Track Perpendicular Media for High Recording Density"; IEEE Transactions on Magnetics, vol. 40, No. 4 Jul. 2004; pp. 2510-2515.

\* cited by examiner

METHOD FOR PATTERN FORMATION

CROSS-REFERENCE TO RELATED APPLICATION

This application is based upon and claims the benefit of priority from the prior art Japanese Patent Application No. 221555/2006, filed on Aug. 15, 2006; the entire contents of which are incorporated herein by reference.

BACKGROUND OF THE INVENTION

The present invention relates to a method for fabricating a fine pattern that has a periodic array structure and utilizes a self-organizational phase separation structure of a block copolymer.

The method for pattern formation according to the present invention is suitable for use, for example, in the manufacture of high-density recording media and highly integrated electronic components.

A recent rapid improvement in function of information technology equipment such as personal computers relies greatly on advance in microfabrication technology used, for example, in the manufacture of semiconductor devices. Up to now, an attempt to increase the fineness of fabrication dimension has been forwarded mainly by using an exposure light source, which emits shorter wavelength light, in lithography. Increased fineness of fabrication dimension and increased pattern density, however, have led to huge cost of lithography in the manufacturing process. Improving the fineness of pattern dimension to smaller than 100 nm is required of next generation semiconductor devices or high-density microfabricated recording media, such as patterned media. For example, electron beams are considered effective as an exposure light source for this purpose. This, however, involves a large problem with fabrication throughput.

Under the above circumstances, fabrication methods utilizing a phenomenon that a material forms a specific ordered array pattern in a self-organizational manner, have been proposed as a fabrication method that is low in cost and, at the same time, can realize high throughput. Among others, according to a method utilizing a "block copolymer," a single-layer ordered array pattern can be formed by a simple process in which a solution of a block copolymer dissolved in a suitable solvent is coated onto an object, and the application of this method as a microfabrication method has also been reported (see, for example, R Mansky et al.; Appl. Phys. Lett., vol. 68, p. 2586 and M. Park et al.; Science, vol. 276, p. 1401).

These proposed methods comprise removing one polymer phase having a phase-separated structure of a block copolymer by ozone treatment, plasma etching, electron beam irradiation or the like to form a concave-convex pattern and fabricating an underlying substrate using the concave-convex pattern as a mask.

In general, however, the size in the layer thicknesswise direction of the phase-separated structure of the block copolymer is equal to or smaller than the size of a pattern formed in a two-dimensional direction on the substrate, and, hence, it is difficult to satisfactorily ensure etching resistance of the pattern formed as the mask. Accordingly, when the object is etched using this phase-separated structure of the block copolymer mask as an etching mask, the fabrication of a structure having a satisfactorily high aspect ratio is impossible.

In order to solve the above problem, a method has also been proposed which comprises once transferring a self-organized pattern of a block copolymer onto a pattern transfer film underlying the block copolymer, for example, by plasma etching, and etching an underlying thick resist film by oxygen plasma using the pattern transfer film as an etching mask to transfer a high-aspect ratio pattern onto the underlying resist film (see JP-A 2001-323736 (Kokai) and M. Park et al.; Appl. Phys. Lett., vol. 79, p. 257).

Also in this method, however, since a high aspect ratio is not obtained in the transfer of the block copolymer onto the pattern transfer film, in some cases, the pattern cannot be faithfully transferred without difficulties. Unsatisfactory aspect ratio in etching means that very small unevenness of film thickness distribution and self-organized pattern in the block copolymer film is highlighted as a variation in etching depth in the pattern transfer film and is transferred onto the pattern transfer film. In the extreme case, this can result in disappearance of a part of a pattern in the underlying resist film.

A method for amplifying etching selection ratio of a diblock copolymer comprising components different from each other in etching aspect ratio has been proposed as a method for overcoming the above drawback (see JP-A 2003-155365). This method comprises bringing one component in the diblock copolymer to a concave form by plasma etching, filling the concaves with a component having high etching resistance such as a silicon compound by spin coating, and again transferring the pattern onto the underlying film by plasma etching. This method suffers from a problem of complicated process.

On the other hand, in the utilization of the self-organization, the regulation of the ordered array direction of the ordering is also important. In the case of patterned media expected to realize high density in magnetic recording media, access to each of patterned magnetic material particles is required in reproduction or recording. In this case, in order that a reproduction head tracks a record line, the magnetic material particles should be arranged in one direction.

Electronic elements such as quantum effect devices, which handle single electrons and the like as information, are expected as elements that have the potential to realize a further improvement in density and power consumption over the current semiconductor devices. Also in this case, an electrode for detecting signals should be disposed in the structure that develops quantum effect. Accordingly, the microstructure which develops quantum effect should have a predetermined array, and, at the same time, the formed region should be properly regulated.

In order to regulate the array direction of the self-organization of the block copolymer, a proposal has been made in which a groove structure is previously formed in a substrate and the array direction of the particles is regulated using the groove structure as a guide (see R. A. Segalman et al.; Bulletin of the American Physical Society, Vol. 45, No. 1, p. 559, ibid., Vol. 46, No. 1, p. 1000, M. Trawick et al.; and ibid., Vol. 46, No. 1, p. 1000). In the above methods, the array direction of the diblock copolymer can be rendered uniform, but on the other hand, as described above, since the aspect ratio in the phase separated structure of the diblock copolymer is low, the formation of a pattern having a satisfactorily high aspect ratio by etching is impossible. Further, at the present time, any method for depositing the diblock copolymer only in any desired region has not been proposed.

Studies on techniques for forming a fine pattern utilizing the self-organization of a specific block copolymer have also been made (see Erik M. Freer et al.; Nano Letters, 2005, Vol. 5, No. 10, p. 2014 to 2018). Methods proposed in these studies, however, also have many problems with compatibility and cannot be said to be effective for stably forming high-quality fine patterns.

BRIEF SUMMARY OF THE INVENTION

In view of the above problems of the prior art, the present invention has been made, and an object of the present invention is to provide a method for pattern formation that, in a microfabrication technique using an etching mask formed by self-organization of a block copolymer, can transfer a pattern having both satisfactory etching resistance and a high aspect ratio and formed by self-organization onto an object faithfully in a simple process.

The above object of the present invention can be attained by a method for pattern formation, comprising the steps of: coating a composition comprising a block copolymer, a silicon compound, and a solvent for dissolving these components onto an object to form a layer of the composition on the object; subjecting the composition layer to self-organization of the block copolymer to cause phase separation into a first phase, in which the silicon compound is localized, having higher etching resistance and a second phase comprising a polymer phase and having lower etching resistance and thereby forming a pattern layer with a fine pattern; and etching the object using as a mask the pattern layer with the fine pattern.

According to another aspect of the present invention, there is provided a pattern formed product produced by the above method.

In the method for pattern formation according to the present invention, a fine pattern is formed by causing microphase separation of a composition layer, comprising a block copolymer, a silicon compound, and a solvent for dissolving these components, by the self-organization of the block copolymer into a phase, in which the silicon compound is localized, having higher etching resistance and a phase comprising a polymer phase and having lower etching resistance. According to this constitution, a fine mask pattern having a high aspect ratio can be formed rapidly in a simple process.

BRIEF DESCRIPTION OF THE SEVERAL VIEWS OF DRAWINGS

DETAILED DESCRIPTION OF THE INVENTION

The method for pattern formation according to the present invention comprises the steps of: coating a composition comprising a block copolymer, a silicon compound, and a solvent for dissolving these components onto an object to form a layer of the composition on the object; subjecting the layer of the composition to self-organization of the block copolymer to cause microphase separation into a first phase, in which the silicon compound is localized, having higher etching resistance and a second phase comprising a polymer phase and having lower etching resistance and thereby forming a pattern layer with a fine pattern formed therein; and etching the object using as a mask the pattern layer with the fine pattern formed therein.

The method for pattern formation according to the present invention will be described with reference to the accompanying drawings.

FIGS. 1A, 1B, 1C, 1D and 1E are respective process sectional views illustrating an embodiment of the method according to the present invention.

Figure 1A:
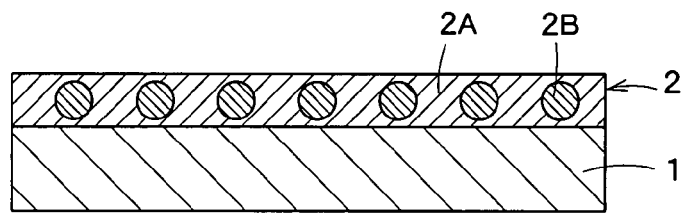
FIGS. 1A, 1B, 1C, 1D and 1E are respective process section views illustrating a method in accordance with one embodiment of the present invention.

At the outset, as shown in FIG. 1A, a block copolymer layer 2 is formed as a first resist layer on an object 1. The block copolymer layer 2 is formed by coating an object with a composition comprising a block copolymer, a silicon compound, and a solvent for dissolving these components.

The block copolymer is a copolymer having a self-organizational phase separation capability and is particularly preferably a copolymer comprising at least polyethylene oxide as a copolymer component.

An A-B-type "diblock copolymer" comprising two types of polymer chains A and B bonded to each other may be mentioned as a specific preferred example of the diblock copolymer. Suitable A-B-type diblock copolymers usable herein include, but are not limited to, polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethyl methacrylate, polystyrene-polymethacrylic acid, polyethylene oxide-polyvinylpyridine, polystyrene-polyvinylpyridine, and polyisoprene-polyhydroxystyrene.

Further, in the present invention, a "triblock copolymer" in which two types of polymer chains have been bonded in an A-B-A form or in which three types of polymer chains have been bonded in an A-B—C form, may also be used.

A structure in which one component in the above A-B-type diblock copolymer has been further bonded to the end of the other component, may be mentioned as the copolymer in which two types of polymer chains have been bonded in an A-B-A form.

A combination of three types of polymer chains selected from the components constituting the A-B-type and A-B-A-type block copolymers may be mentioned as the triblock copolymer in which the three types of polymer chains have been bonded in an A-B—C form. Suitable examples thereof include, but are not limited to, include polymers selected from polystyrene, polyisoprene, polyvinylpyridine, polyhydroxystyrene, polyethylene oxide, and polypropylene oxide.

Next, the silicon compound is not particularly limited so far as it can realize the method according to the present invention. In general, siloxane compound having a siloxane bond or derivatives thereof are suitable. More specifically, silicon compounds suitable in the present invention have affinity for only one component in the block copolymer. Alternatively, preferably, the block copolymer comprises at least two components of a first component and a second component, and the first component has affinity for the silicon compound while the second component does not have affinity for the silicon compound. When a silicon compound, which has affinity for all the components of the block copolymer, is used, it should be noted that, in the phase separation of the block copolymer, localization only in one phase of the silicon compound cannot be expected, and, when a common solvent cannot be applied as a good solvent, in the film formation, unfavorable phenomena such as the precipitation of only one component occur.

From the viewpoints of stability in the solution or after coating, compatibility with the block copolymer and the like, silicon compounds having structures represented by general formulas (1) to (4) are preferred as the silicon compound.

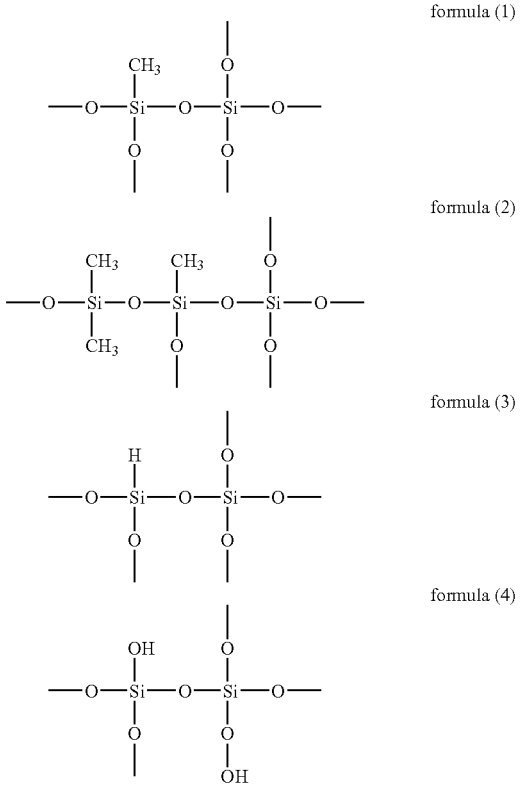

formula (1)
formula (2)
formula (3)
formula (4)

Organic or inorganic silicon-containing compounds such as the above exemplified silicates, hydrogensiloxane, and methylsiloxane are preferred. Hydrogen silsesquioxane, methyl silsesquioxane and the like, when combined with suitable other component(s), are also applicable. According to the finding of the present inventors, however, these silicon compounds, when brought to a block copolymer mixed solution, are likely to form aggregates and thus have problems with storage stability and film quality stability after film formation.

The above silicon compound and block copolymer are dissolved in a solvent compatible with the components to prepare a composition. In this case, solvents capable of dissolving the block copolymer and the silicon compound are used. Specifically, the solvent is preferably selected from the group consisting of ethers having an ethylene glycol structure, preferably diethylene glycol dimethylether (diglyme), diethylene glycol diethyl ether, diethylene glycol dibutyl ether, diethylene glycol monomethyl ether, diethylene glycol monoethyl ether and mixtures thereof. Specific examples of preferred solvents include ketones such as MIBK and acetone, alcohols such as methanol, ethanol, and IPA, and ether derivatives such as propylene glycol monopropyl ether.

In particular, when a block copolymer of polyethylene oxide desired as a carrier for the silicon-containing compound is used, preferably, an ethylene oxide derivative is used as at least one solvent. For example, diethyleneglycoldimethylether (diglyme), diethylene glycol diethyl ether, diethylene glycol dibutyl ether, diethylene glycol monomethyl ether, and diethylene glycol monoethyl ether as described above are preferred as the ethylene oxide derivative, for example, from the viewpoint of the boiling point of the solvent.

In the composition comprising the components, the content of the solid component of the polymer and the silicon compound is preferably 0.5 to 40% by weight, more preferably 0.5 to 20% by weight, particularly preferably 1 to 10% by weight, based on the whole composition.

The content of the silicon compound is preferably 1 to 1000% by weight, more preferably 10 to 500% by weight, particularly preferably 50 to 300% by weight, based on the polymer component although it varies depending upon the composition ratio of the polymer mixed.

As shown in FIG. 1A, the prepared composition is coated onto an object 1 by suitable means, and, if necessary, is annealed in a solvent atmosphere or at a suitable temperature to cause phase separation into a polymer phase 2A and a polymer phase 2B and thus to form an ordered array structure. In this case, when the block copolymer has a relatively small molecular weight, an ordered array structure is sometimes formed in the course of evaporation of the solvent after coating of the composition onto the substrate. In this embodiment, the phase separated structure is of a single layer type which can be formed by regulating the layer thickness. In FIG. 1A, the formed structure is such that the polymer phase 2A constitutes a matrix and the polymer phase 2B is orderly arrayed two-dimensionally in the polymer phase 2A. In this structure, the silicon compound is locally present only in any one of the phases 2A and 2B. The shape and size of the polymer phases 2A and 2B constituting the ordered array structure depend upon the length of the polymer chains (A, B and C) in each block constituting the block copolymer and the amount of the silicon compound added, and the size can be regulated to a very small size, for example, about 100 nm or less, by regulating them.

Figure 1B:
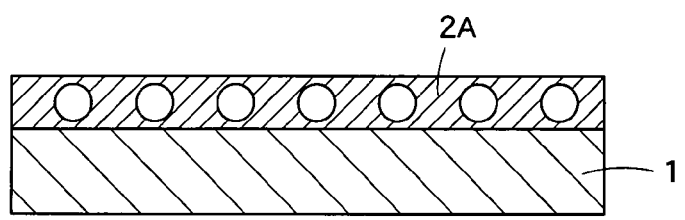

Further, in the present invention, as shown in FIG. 1B, the phase having lower etching resistance (phase free from localized silicon compound) in the above polymer phases can be removed by heating treatment or/and oxygen plasma treatment. The organic component in the polymer phase can be selectively removed by exposure to plasma, light, electron beams or other energy radiations or heat.

Figure 1C:
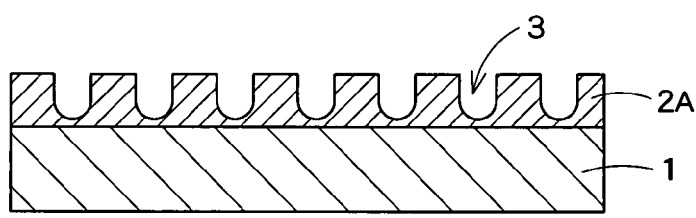

Usual organic components can be removed through decomposition or vaporization, for example, by heating at 200 to 450° C. or can be selectively removed by oxygen plasma treatment. Upon the heat or oxidation treatment, the silicon-containing compound locally present in the polymer phase A or B causes a crosslinking reaction to form a film structure while maintaining the fine structure as shown in FIG. 1C. In the embodiment shown in FIG. 1B, the silicon compound is localized in the polymer phase 2A (that is, phase 2A is a phase having etching resistance).

Thus, a resist layer (polymer phase) 2A comprising an orderly arrayed concave part 3 can be formed by selectively removing at least one polymer phase 2B in the block copolymer film having a phase separated structure of an orderly arrayed pattern with a size of not more than 100 nm (FIG. 1C).

Figure 1D:
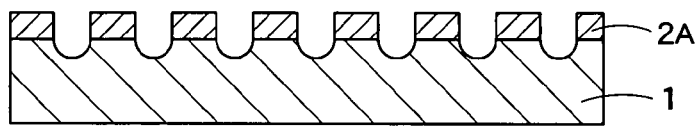
Figure 1E:

A fine pattern having a high aspect ratio can be formed on an object 1 by directly etching the object 1 using the formed mask pattern as shown in FIGS. 1D and 1E. The polymer phase 2A remaining unremoved in the object 1 can be removed by suitable means.

The embodiment shown in FIGS. 2A, 2B, 2C, 2D and 2E is an embodiment in which a pattern of a resist layer which functions as an etching mask, is previously formed on an object.

Figure 2A:
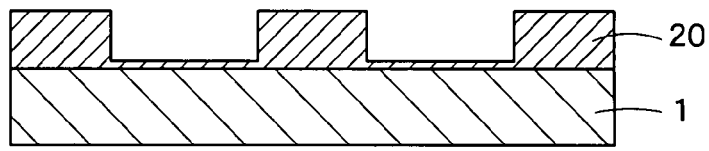
FIGS. 2A, 2B, 2C, 2D and 2E are respective process section views illustrating a method in accordance with another embodiment of the present invention.
Figure 2B:
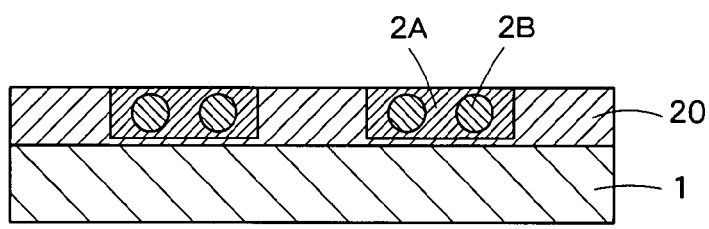

Specifically, as shown in FIG. 2A, a concave-convex pattern of a resist layer 20 which functions as an etching mask is first formed on an object 1. Next, the concave part in the resist layer 20 is filled with a coating composition, that is, a coating composition is coated onto the resist layer 20 on its concave part overlying the object 1 by suitable means in the same manner as in the embodiment described with reference to FIGS. 1A-1E. If necessary, annealing treatment is carried out in a solvent atmosphere or at a suitable temperature. Thus, phase separation into a polymer phase 2A and a polymer phase 2B takes place to form an orderly arrayed structure.

Figure 2C:
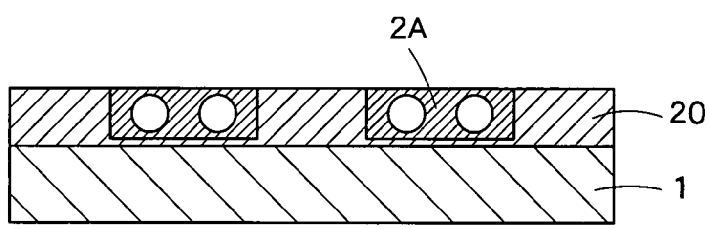
Figure 2D:
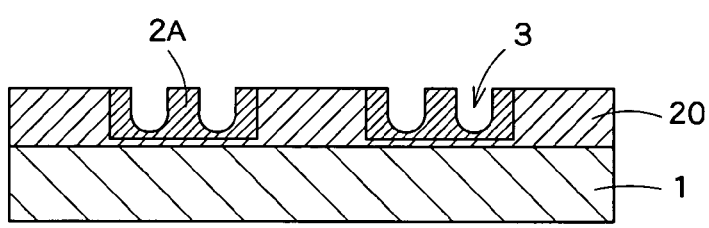
Figure 2E:
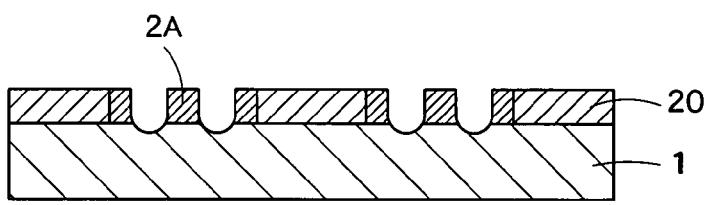

Next, as shown in FIG. 2C, the phase having lower etching resistance (phase free from localized silicon compound) in the above polymer phases is removed by heat treatment or/and oxygen plasma treatment, and etching is carried out using the resist layer 20 as a mask to further etch the underlying object 1 (FIGS. 2D and 2E). Accordingly, in etching, the material for the resist layer 20 and the etching method should be selected so that the resist layer 20 functions as an etching mask.

Thus, in the embodiment shown in FIGS. 2A-2E, before the formation of the composition layer of a block copolymer, a concave-convex pattern is formed on the surface of an object. Accordingly, the array structure of the formed block copolymer layer is arranged according to the concave-convex pattern, and, thus, the alignment of the ordered structure can be actively controlled. In this case, any material may be used for the preparation of the convex-concave pattern as the surface layer which functions as a guide so far as the contemplated object can be attained. However, the use of the silicon compound as a material is preferred for the formation of a mask except for in the processing part.

The polymer composition may be coated on a substrate (an object), for example, by spin coating, dip coating, spray coating or ink jet coating, followed by imprinting.

The object is not particularly limited. However, for example, plastic substrates, glass substrates, and silicon substrates are generally used. If necessary, after surface treatment or the formation of various films, a composition layer (a thin film) is formed according to the above-described proper method.

As described above, according to the present invention, a fine ordered pattern on a level of 100 nm or less can be efficiently formed by a relatively simple process. Further, according to the present invention, the number of steps can be reduced as compared with the conventional process. Accordingly, an increase in the level of contamination caused by increasing the number of steps can be prevented to improve the quality, and, at the same time, the stability of the process can be advantageously improved.

EXAMPLES

The following Examples further illustrate the present invention. However, it should be noted that the present invention is not limited to these Examples.

Example 1

A diblock copolymer comprising polystyrene (PS) having a molecular weight of 9500 and polyethylene oxide (PEO) having a molecular weight of 9500 was dissolved in diglyme to prepare a 2.5% polymer solution for coating. 125 mg of T-7 (5500T) manufactured by Tokyo Ohka Kogyo Co., Ltd., which is a solution of a methylsiloxane derivative, was added to 250 mg of the polymer solution to give a homogeneous solution.

The homogeneous solution thus obtained was filtered through a membrane filter having a pore size of 0.5 μm and was coated onto a silicon wafer (a substrate) to a thickness of 30 nm. The coated substrate was placed in a nitrogen atmosphere oven, was heated to 400° C. at a temperature rise rate of 1.5° C./min, and was held at the temperature for 2 hr.

The cross-section of the baked film thus obtained was observed under TEM. As a result, it was found that about 23 nm-pitch holes were formed. Next, etching with $SF_6$ gas was carried out using the formed pattern as a mask. As a result, the pattern could be transferred to the silicon substrate.

Example 2

A film having a microstructure was prepared in the same manner as in Example 1, except that a block copolymer comprising polystyrene (PS) having a molecular weight of 3800 and polyethylene oxide (PEO) having a molecular weight of 6500 was used instead of the block copolymer used in Example 1.

It was found that, in the baked film thus obtained, 15 nm-pitch holes were formed. In the same manner as in Example 1, the pattern was transferred to the underlying silicon substrate.

Example 3

A film having a microstructure was prepared in the same manner as in Example 1, except that a block copolymer comprising polystyrene (PS) having a molecular weight of 3000 and polyethylene oxide (PEO) having a molecular weight of 3000 was used instead of the block copolymer used in Example 1.

It was found that, in the baked film thus obtained, 15 nm-pitch cylinders were formed. In the same manner as in Example 1, the pattern was transferred to the underlying silicon substrate.

Example 4

In the same manner as in Example 1, the mixed solution containing the polymer and the silicon compound was coated onto the substrate. The coated substrate was heated to 200° C. at a temperature rise rate of 1.5° C./min and was held at 200° C. for 2 hr. Next, oxygen plasma treatment was carried out to completely remove the organic matter. As a result, the microstructure on the substrate had the same quality as that in Example 1.

Example 5

A diblock copolymer comprising polystyrene having a molecular weight of 3000 and polyethylene oxide having a molecular weight of 3000 was dissolved in diglyme. The solution was mixed with T-7 (5500T) to prepare a mixed solution which was then coated onto a substrate.

The coated substrate was heated at a temperature of 120° C. for 90 sec to remove the solvent and was then exposed to oxygen plasma to remove the organic matter. The pattern thus obtained was the same as the pattern formed in Example 3.

Reference Example 1

The preparation of a mixed solution comprising a diblock copolymer and a silicon compound and firing treatment were carried out in the same manner as in Example 1, except that HSQ (hydrogensilsesquioxane) (T-12 (600V), manufactured by Tokyo Ohka Kogyo Co., Ltd.) was used as the silicon compound.

The fired film thus obtained was observed under a microscope. As a result, it was found that a number of aggregates were observed and the film was not homogeneous and flat.

Reference Example 2

A mixed solution comprising a polymer and a silicon compound was prepared in the same manner as in Example 1, except that toluene was used as the solvent for the diblock copolymer. As a result, due to low solubility of the diblock copolymer in toluene, a homogeneous solution could not be prepared even when the concentration was brought to 1.2%.

What is claimed is:

1. A method for pattern formation, comprising:
coating a composition comprising a block copolymer, a silicon compound, and a solvent for dissolving these components onto an object to form a layer of the composition on the object;
subjecting the layer of the composition to self-organization of the block copolymer to cause phase separation into a first phase, in which the silicon compound is localized, having higher etching resistance by heat treatment or/and oxygen plasma treatment, and a second phase comprising a polymer phase and having lower etching resistance by heat treatment or/and oxygen plasma treatment, and thereby forming a pattern layer with a fine pattern; and
etching the object using as a mask the thus formed pattern layer,
wherein said silicon compound has a structure represented by one of the general formulas (1) to (4):

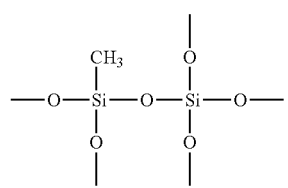

formula (1)

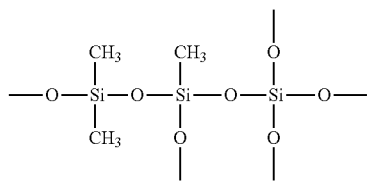

formula (2)

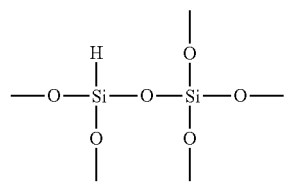

formula (3)

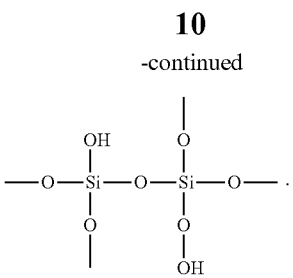

formula (4)

2. The method according to claim 1, wherein said block copolymer comprises a copolymer having a self-organizing phase separation function.

3. The method according to claim 1, wherein said block copolymer comprises a first component and a second component, said first component has affinity for said silicon compound while said second component does not have affinity for said silicon compound.

4. The method according to claim 1, wherein said solvent is selected from the group consisting of ethers having an ethylene glycol structure.

5. The method according to claim 1, wherein said block copolymer comprises a "diblock copolymer" comprising two polymer chains A and B bonded to each other.

6. The method according to claim 5, wherein said diblock copolymer includes a material selected from the group consisting of polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethyl methacrylate, polystyrene-polymethacrylic acid, polyethylene oxide-polyvinylpyridine, polystyrene-polyvinylpyridine, and polyisoprene-polyhydroxystyrene.

7. The method according to claim 1, wherein said block copolymer comprises a triblock copolymer in which two polymer chains have been bonded in an A-B-A form or in which three polymer chains have been bonded in an A-B—C form.

8. The method according to claim 7, wherein said triblock copolymer includes a material selected from the group consisting of polystyrene, polyisoprene, polyvinylpyridine, polyhydroxystyrene, polyethylene oxide, and polypropylene oxide.

9. The method according to claim 1, wherein said block copolymer comprises at least polyethylene oxide as a copolymer component.

10. The method according to claim 1, wherein said solvent is selected from the group consisting of diethylene glycol dimethyl ether (diglyme), diethylene glycol diethyl ether, diethylene glycol dibutyl ether, diethylene glycol monomethyl ether, diethylene glycol monoethyl ether, and mixtures thereof.

* * * * *